United States Patent
Sethumadhavan et al.

(10) Patent No.: US 9,596,755 B2
(45) Date of Patent: Mar. 14, 2017

(54) MAGNETO-DIELECTRIC SUBSTRATE, CIRCUIT MATERIAL, AND ASSEMBLY HAVING THE SAME

(71) Applicant: ROGERS CORPORATION, Rogers, CT (US)

(72) Inventors: Murali Sethumadhavan, Acton, MA (US); Allen F. Horn, III, Pomfret Center, CT (US); Karl Edward Sprentall, Scottsdale, AZ (US); Michael White, Pomfret Center, CT (US)

(73) Assignee: ROGERS CORPORATION, Rogers, CT (US)

(*) Notice: Subject to any disclaimer, the term of this patent is extended or adjusted under 35 U.S.C. 154(b) by 0 days.

(21) Appl. No.: 14/882,967

(22) Filed: Oct. 14, 2015

(65) Prior Publication Data

US 2016/0113113 A1   Apr. 21, 2016

Related U.S. Application Data

(60) Provisional application No. 62/064,244, filed on Oct. 15, 2014.

(51) Int. Cl.
*H05K 1/03* (2006.01)
*H01F 1/34* (2006.01)
(Continued)

(52) U.S. Cl.
CPC .......... *H05K 1/0353* (2013.01); *D06M 11/83* (2013.01); *D06M 15/227* (2013.01); *H01F 1/348* (2013.01); *H01F 17/0006* (2013.01); *H05K 3/043* (2013.01); *H05K 3/061* (2013.01); *H05K 3/4644* (2013.01); *D06M 2200/00* (2013.01); *H05K 2201/083* (2013.01)

(58) Field of Classification Search
CPC .......................... H05K 1/0353; H05K 1/0373
See application file for complete search history.

(56) References Cited

U.S. PATENT DOCUMENTS

| | | |
|---|---|---|
| 4,647,508 A | 3/1987 | Gazit et al. |
| 4,725,490 A | 2/1988 | Goldberg |

(Continued)

FOREIGN PATENT DOCUMENTS

| | | |
|---|---|---|
| EP | 0707038 A1 | 4/1996 |
| EP | 1819211 A1 | 8/2007 |
| JP | 2006290917 | 10/2006 |

OTHER PUBLICATIONS

Cruz-Montoya et al., "Synthesis and characterization of polymer nanocomposites containing magnetic nanoparticles"; Journal of Applied Physics 107; 09B506 (2010); 4 pgs.

Huang et al; "Magnetic epoxy nanocomposites with superparamegnetic MnFe204 nanoparticles"; AIP Advance 5; 097183 (2015); 16 pgs.

Pal et al.; "Synthesis and magnetic properties of gold coated iron oxide nanoparticles"; Journal of Applied Physics 105; 07B504 (2009); 4 pgs.

(Continued)

*Primary Examiner* — Jeremy C Norris
(74) *Attorney, Agent, or Firm* — Cantor Colburn LLP

(57) ABSTRACT

In an embodiment, a magneto-dielectric substrate comprises a dielectric polymer matrix; and a plurality of hexaferrite particles dispersed in the polymer matrix in an amount and of a type effective to provide a magneto-dielectric substrate having a magnetic constant of greater than or equal to 2.5 from 0 to 500 MHz, or 3 to 8 from 0 to 500 MHz; a magnetic loss of less than or equal to 0.1 from 0 to 500 MHz, or 0.001 to 0.05 over 0 to 500 MHz; and a dielectric constant of 1.5 to 8 or 2.5 to 8 from 0 to 500 MHz.

19 Claims, 3 Drawing Sheets

(51) Int. Cl.
*H01F 17/00* (2006.01)
*D06M 11/83* (2006.01)
*D06M 15/227* (2006.01)
*H05K 3/04* (2006.01)
*H05K 3/06* (2006.01)
*H05K 3/46* (2006.01)

(56) References Cited

U.S. PATENT DOCUMENTS

| | | |
|---|---|---|
| 4,911,957 A | 3/1990 | Oishi et al. |
| 5,223,568 A | 6/1993 | Landi et al. |
| 6,415,104 B1 | 7/2002 | Fitts et al. |
| 6,586,533 B1 | 7/2003 | Landi et al. |
| 8,305,281 B2 | 11/2012 | Suetsuna et al. |
| 8,323,728 B2 | 12/2012 | Iorio et al. |
| 2005/0003199 A1 | 1/2005 | Takaya et al. |
| 2005/0216075 A1 | 9/2005 | Wang et al. |
| 2006/0154052 A1 | 7/2006 | Waffenschmidt et al. |
| 2006/0262030 A1 | 11/2006 | Bae et al. |
| 2008/0096009 A1 | 4/2008 | Xiao et al. |
| 2010/0231433 A1 | 9/2010 | Tishin et al. |
| 2012/0249375 A1 | 10/2012 | Heino et al. |
| 2013/0334455 A1 | 12/2013 | Weller et al. |
| 2014/0103247 A1 | 4/2014 | Weller et al. |
| 2016/0099498 A1 | 4/2016 | Pance et al. |

OTHER PUBLICATIONS

Sahu et al.; "Influence of excess Fe accumulation over the surface of FePt nanoparticles: Structural and magnetic properties"; Journal of Applied Physics 113; 134303 (2013); 1 pg. Abstract only.
Than H Ba Do; "High Temperature Composite Materials and Magnetodielectric Composites for Microwave Application"; Dissertation; University of Michigan; 2010; 223 pages.
Buell, "Development of Engineered Magnetic Materials for Antenna Applications", Dissertation, University of Michigan, 2005, 198 pages.
International Application No. PCT/US2015/055621; International Filing Date Oct. 15, 2015; International Search Report (6 pages).
International Application No. PCT/US2015/055621; International Filing Date Oct. 15, 2010; Written Opinion of the International Search Authority; 15 pages.
Yang, Guo-Min, et al., "Miniaturized Patch Antennas with Ferrite/Dielectric/Ferrite Magnetodielectric Sandwich Substrate", Piers Online, vol. 7, No. 7, (Jan. 1, 2011), pp. 609-612.
Yang, Guo-Min, et al., "Novel Compact and Low-Loss Phase Shifters With Magnetodielectric Disturber", IEEE Microwave and Wireless Components Letters, vol. 21, No. 5, (May 1, 2011); pp. 240-242.
Martin et al.; "Flexible Magnetic Composites"; Passive RF Component Technoloby, Materials Techniques and Applications; Chapter 8; 2012; pp. 156-185.

US 9,596,755 B2

MAGNETO-DIELECTRIC SUBSTRATE, CIRCUIT MATERIAL, AND ASSEMBLY HAVING THE SAME

CROSS-REFERENCE TO RELATED APPLICATION

This application claims the benefit of U.S. Provisional Patent Application Ser. No. 62/064,244 filed Oct. 15, 2014. The related application is incorporated herein by reference.

BACKGROUND

The present disclosure relates generally to a magneto-dielectric substrate useful in applications such as metal clad circuit materials for circuits, antennas, and the like.

Newer designs and manufacturing techniques have driven electronic components to increasingly smaller dimensions, for example, components such as inductors on electronic integrated circuit chips, electronic circuits, electronic packages, modules and housings, UHF, VHF, and microwave antennas. One approach to reducing electronic component size has been the use of magneto-dielectric materials as substrates. In particular, ferrites, ferroelectrics, and multiferroics have been widely studied as functional materials with enhanced microwave properties. However, these materials are not entirely satisfactory, in that they may not provide the desired bandwidth or have the desired mechanical performance for a given application. Developing materials with sufficient flame retardancy has been particularly difficult because the particulate metallic fillers used to impart the desired magneto-dielectric properties are combustible. Such fillers are also not stable under high humidity conditions, even when surrounded by the polymeric matrix.

There accordingly remains a need in the art for magneto-dielectric materials for use in dielectric substrates having optimal magnetic and dielectric properties at frequencies greater than 100 megaHertz (MHz), while at the same time having optimal thermomechanical and electrical properties for circuit fabrication. In particular, there remains a need for magneto-dielectric substrates with one or more of low dielectric and magnetic losses, low power consumption, low biasing electric or magnetic fields, flame retardance, and other improved mechanical properties. It would be a further advantage if the materials were easily processable and integratable with existing fabrication processes. It would be a still further advantage if the thermomechanical and electrical properties were stable over the lifetime of the substrates under conditions of heat and humidity.

BRIEF DESCRIPTION

In an embodiment, a magneto-dielectric substrate comprises a dielectric polymer matrix; and a plurality of hexaferrite particles dispersed in the polymer matrix in an amount and of a type effective to provide a magneto-dielectric substrate having a magnetic constant of greater than or equal to 2.5 from 0 to 500 MHz, or 3 to 8 from 0 to 500 MHz; a magnetic loss of less than or equal to 0.1 from 0 to 500 MHz, or 0.001 to 0.05 over 0 to 500 MHz; and a dielectric constant of 1.5 to 8 or 2.5 to 8 from 0 to 500 MHz.

In an embodiment, a method of making the magneto-dielectric substrate comprises dispersing a plurality of hexaferrite particles in a curable polymer matrix composition; forming a layer from the curable polymer matrix composition and the dispersed particles; and curing the polymer matrix composition.

In an embodiment, a circuit material comprises a conductive layer; and a magneto-dielectric substrate disposed on the conductive layer.

In an embodiment, a method of making a circuit material comprises dispersing a plurality of hexaferrite particles in a curable polymer matrix composition; forming a layer from the curable polymer matrix composition and the dispersed particles; disposing the formed layer on a conductive layer; and curing the polymer matrix composition.

In an embodiment, an antenna comprises a magneto-dielectric substrate.

In another embodiment, an RF component comprises a magneto-dielectric substrate.

The above features and advantages and other features and advantages are readily apparent from the following detailed description when taken in connection with the accompanying drawings.

BRIEF DESCRIPTION OF THE DRAWINGS

Referring to the exemplary non-limiting drawings wherein like elements are numbered alike in the accompanying Figures.

DETAILED DESCRIPTION

Figure 1:
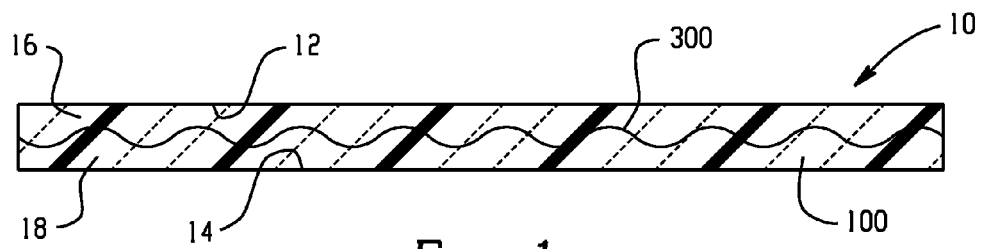
FIG. 1 depicts an embodiment of a section view of a magneto-dielectric substrate having a woven reinforcement.

Magneto-dielectric substrates with optimal magnetic, dielectric, and physical properties at frequencies below 500 MHz for circuit fabrication are highly desirable. The inventors hereof have found that magneto-dielectric substrates comprising magnetic fillers such as iron particles resulted in substrates that were either flammable; not stable in humidity or with temperature change, even when located within the substrates; or had high magnetic loss values. The inventors hereof surprisingly discovered a magneto-dielectric substrate capable of comprising a plurality of hexaferrite particles was capable of operating at frequencies from 0 to 500 MHz without significant increase of eddy-current power loss. For example, a magneto-dielectric substrate comprising a plurality of hexaferrite particles can have a magnetic constant (also known as a magnetic permeability) of greater than or equal to 1.5 measured in the range of 0 to 500 MHz and a magnetic loss of less than or equal to 0.1 measured in the range of 0 to 500 MHz, and optionally matching dielectric properties (for example, the dielectric constant, e', divided by the magnetic constant, u', can be less than or equal to 3, or less than or equal to 2, or less than or equal to 2.2). The magneto-dielectric substrate comprising the magnetic filler can also surprisingly display one or both of improved flammability and stability when used in a circuit. Use of specific dielectric polymers allows the materials to be readily processed and able to withstand circuitization conditions.

As shown and described by the various figures and accompanying text, the magneto-dielectric substrate comprises a polymer matrix composition comprising a plurality of magnetic particles, specifically, hexaferrite particles disposed therein and optionally, a reinforcing layer.

The magneto-dielectric layer and substrate comprises a polymer matrix composition, specifically a thermosetting polymer matrix composition. The thermosetting polymer in the composition can comprise polybutadiene; polyisoprene; an epoxy; a phenolic polymer; a polyester (such as those available under trade names DOLPHON, SYNTHITE, DOLFEX, and HI-THERM, from John C. Dolph Co., Monmouth Junction, New Jersey); a polyimide; a silicone (such as those available from Wacker); a bismaleimide triazine (BT) resin; a benzoxazine; a polystyrene; a poly(($C_{1-4}$ alkyl methacrylate); a poly($C_{1-4}$ alkyl acrylate); an allylated poly (arylene ether); or a combination comprising at least one of the foregoing polymers. Other thermosetting polymers that can be used include those modified to be thermosetting, for example liquid crystalline polymers are generally thermoplastic polymers, but they can also be used as thermosets by functionalization or by compounding with a thermoset such as an epoxy. The epoxy can comprise a cycloaliphatic type epoxy, a digycidyl ether of bisphenol A, a cresol novolak, a phenolic epoxy, a bismaleimide-triazine epoxy, a cyanate ester-epoxy mixture, or a combination comprising at least one of the foregoing.

The polymer of the polymer matrix composition can comprise a thermosetting polybutadiene and/or polyisoprene. As used herein, the term "thermosetting polybutadiene and/or polyisoprene" includes homopolymers and copolymers comprising units derived from butadiene, isoprene, or mixtures thereof. Units derived from other copolymerizable monomers can also be present in the polymer, for example, in the form of grafts. Copolymerizable monomers include, but are not limited to, vinylaromatic monomers, for example, substituted and unsubstituted monovinylaromatic monomers such as styrene, 3-methylstyrene, 3,5-diethylstyrene, 4-n-propylstyrene, alpha-methylstyrene, alpha-methyl vinyltoluene, para-hydroxystyrene, para-methoxystyrene, alpha-chlorostyrene, alpha-bromostyrene, dichlorostyrene, dibromostyrene, tetra-chlorostyrene, and the like; and substituted and unsubstituted divinylaromatic monomers such as divinylbenzene, divinyltoluene, and the like. Combinations comprising at least one of the foregoing copolymerizable monomers can also be used. Thermosetting polybutadienes and/or polyisoprenes include, but are not limited to, butadiene homopolymers, isoprene homopolymers, butadiene-vinylaromatic copolymers such as butadiene-styrene, isoprene-vinylaromatic copolymers such as isoprene-styrene copolymers, and the like.

The thermosetting polybutadiene and/or polyisoprene polymers can also be modified. For example, the polymers can be hydroxyl-terminated, methacrylate-terminated, carboxylate-terminated, or the like. Post-reacted polymers can be used, such as epoxy-, maleic anhydride-, or urethane-modified polymers of butadiene or isoprene polymers. The polymers can also be crosslinked, for example, by divinylaromatic compounds such as divinyl benzene, e.g., a polybutadiene-styrene crosslinked with divinyl benzene. Polymers are broadly classified as "polybutadienes" by their manufacturers, for example, Nippon Soda Co., Tokyo, Japan, and Cray Valley Hydrocarbon Specialty Chemicals, Exton, Pa. Mixtures of polymers can also be used, for example, a mixture of a polybutadiene homopolymer and a poly(butadiene-isoprene) copolymer. Combinations comprising a syndiotactic polybutadiene can also be useful.

The thermosetting polybutadiene and/or polyisoprene polymer can be liquid or solid at room temperature. The liquid polymer can have a number average molecular weight (Mn) of greater than or equal to 5,000 grams per mole (g/mol) based on polycarbonate standards. The liquid polymer can have an Mn of less than 5,000 g/mol, specifically, 1,000 to 3,000 g/mol. Thermosetting polybutadiene and/or polyisoprenes having at least 90 weight percent (wt %) 1,2 addition, can exhibit greater crosslink density upon cure due to the large number of pendent vinyl groups available for crosslinking.

The polybutadiene and/or polyisoprene can be present in the polymer composition in an amount of up to 100 wt %, specifically, up to 75 wt % with respect to the total polymer matrix composition, more specifically, 10 to 70 wt %, even more specifically, 20 to 60 or 70 wt %, based on the total polymer matrix composition.

Other polymers that can co-cure with the thermosetting polybutadiene and/or polyisoprene can be added for specific property or processing modifications. For example, in order to improve the stability of the dielectric strength and mechanical properties of the electrical substrate material over time, a lower molecular weight ethylene-propylene elastomer can be used in the systems. An ethylene-propylene elastomer as used herein is a copolymer, terpolymer, or other polymer comprising primarily ethylene and propylene. Ethylene-propylene elastomers can be further classified as EPM copolymers (i.e., copolymers of ethylene and propylene monomers) or EPDM terpolymers (i.e., terpolymers of ethylene, propylene, and diene monomers). Ethylene-propylene-diene terpolymer rubbers, in particular, have saturated main chains, with unsaturation available off the main chain for *facile* crosslinking. Liquid ethylene-propylene-diene terpolymer rubbers, in which the diene is dicyclopentadiene, can be used.

The molecular weights of the ethylene-propylene rubbers can be less than 10,000 g/mol viscosity average molecular weight (Mv). The ethylene-propylene rubber can include an ethylene-propylene rubber having an Mv of 7,200 g/mol, which is available from Lion Copolymer, Baton Rouge, La., under the trade name TRILENE™ CP80; a liquid ethylene-propylene-dicyclopentadiene terpolymer rubbers having an Mv of 7,000 g/mol, which is available from Lion Copolymer under the trade name of TRILENE™ 65; and a liquid ethylene-propylene-ethylidene norbornene terpolymer having an Mv of 7,500 g/mol, which is available from Lion Copolymer under the name TRILENE™ 67.

The ethylene-propylene rubber can be present in an amount effective to maintain the stability of the properties of the substrate material over time, in particular the dielectric strength and mechanical properties. Typically, such amounts are up to 20 wt % with respect to the total weight of the polymer matrix composition, specifically, 4 to 20 wt %, more specifically, 6 to 12 wt %.

Another type of co-curable polymer is an unsaturated polybutadiene- or polyisoprene-containing elastomer. This component can be a random or block copolymer of primarily 1,3-addition butadiene or isoprene with an ethylenically unsaturated monomer, for example, a vinylaromatic compound such as styrene or alpha-methyl styrene, an acrylate or methacrylate such a methyl methacrylate, or acrylonitrile. The elastomer can be a solid, thermoplastic elastomer comprising a linear or graft-type block copolymer having a polybutadiene or polyisoprene block and a thermoplastic block that can be derived from a monovinylaromatic monomer such as styrene or alpha-methyl styrene. Block copolymers of this type include styrene-butadiene-styrene triblock copolymers, for example, those available from Dexco Polymers, Houston, Tex. under the trade name VECTOR 8508M™, from Enichem Elastomers America, Houston, Tex. under the trade name SOL-T-6302™, and those from Dynasol Elastomers under the trade name CALPRENE™ 401; and styrene-butadiene diblock copolymers and mixed triblock and diblock copolymers containing styrene and butadiene, for example, those available from Kraton Polymers (Houston, Tex.) under the trade name KRATON D1118. KRATON D1118 is a mixed diblock/triblock styrene and butadiene containing copolymer that contains 33 wt % styrene.

The optional polybutadiene- or polyisoprene-containing elastomer can further comprise a second block copolymer similar to that described above, except that the polybutadiene or polyisoprene block is hydrogenated, thereby forming a polyethylene block (in the case of polybutadiene) or an ethylene-propylene copolymer block (in the case of polyisoprene). When used in conjunction with the above-described copolymer, materials with greater toughness can be produced. A second block copolymer of this type is KRATON GX1855 (commercially available from Kraton Polymers, which is believed to be a mixture of a styrene-high 1,2-butadiene-styrene block copolymer and a styrene-(ethylene-propylene)-styrene block copolymer.

The unsaturated polybutadiene- or polyisoprene-containing elastomer component can be present in the polymer matrix composition in an amount of 2 to 60 wt % with respect to the total weight of the polymer matrix composition, specifically, 5 to 50 wt %, more specifically, 10 to 40 or 50 wt %.

Still other co-curable polymers that can be added for specific property or processing modifications include, but are not limited to, homopolymers or copolymers of ethylene such as polyethylene and ethylene oxide copolymers; natural rubber; norbornene polymers such as polydicyclopentadiene; hydrogenated styrene-isoprene-styrene copolymers and butadiene-acrylonitrile copolymers; unsaturated polyesters; and the like. Levels of these copolymers are generally less than 50 wt % of the total polymer in the polymer matrix composition.

Free radical-curable monomers can also be added for specific property or processing modifications, for example, to increase the crosslink density of the system after cure. Monomers that can be suitable crosslinking agents include, for example, di, tri-, or higher ethylenically unsaturated monomers such as divinyl benzene, triallyl cyanurate, diallyl phthalate, and multifunctional acrylate monomers (e.g., SARTOMER™ polymers available from Sartomer USA, Newtown Square, Pa.), or combinations thereof, all of which are commercially available. The crosslinking agent, when used, can be present in the polymer matrix composition in an amount of up to 20 wt %, specifically, 1 to 15 wt %, based on the total weight of the total polymer in the polymer matrix composition.

A curing agent can be added to the polymer matrix composition to accelerate the curing reaction of polyenes having olefinic reactive sites. Curing agents can comprise organic peroxides, for example, dicumyl peroxide, t-butyl perbenzoate, 2,5-dimethyl-2,5-di(t-butyl peroxy)hexane, α,α-di-bis(t-butyl peroxy)diisopropylbenzene, 2,5-dimethyl-2,5-di(t-butyl peroxy) hexyne-3, or a combination comprising at least one of the foregoing. Carbon-carbon initiators, for example, 2,3-dimethyl-2,3 diphenylbutane can be used. Curing agents or initiators can be used alone or in combination. The amount of curing agent can be 1.5 to 10 wt % based on the total weight of the polymer in the polymer matrix composition.

The polybutadiene or polyisoprene polymer can be carboxy-functionalized. Functionalization can be accomplished using a polyfunctional compound having in the molecule both (i) a carbon-carbon double bond or a carbon-carbon triple bond, and (ii) at least one of a carboxy group, including a carboxylic acid, anhydride, amide, ester, or acid halide. A specific carboxy group is a carboxylic acid or ester. Examples of polyfunctional compounds that can provide a carboxylic acid functional group include maleic acid, maleic anhydride, fumaric acid, and citric acid. In particular, polybutadienes adducted with maleic anhydride can be used in the thermosetting composition. Suitable maleinized polybutadiene polymers are commercially available, for example, from Cray Valley under the trade names RICON 130MA8, RICON 130MA13, RICON 130MA20, RICON 131MA5, RICON 131MA10, RICON 131MA17, RICON 131MA20, and RICON 156MA17. Suitable maleinized polybutadiene-styrene copolymers are commercially available, for example, from Sartomer under the trade names RICON 184MA6. RICON 184MA6 is a butadiene-styrene copolymer adducted with maleic anhydride having styrene content of 17 to 27 wt % and Mn of 9,900 g/mol based on polycarbonate standards.

The relative amounts of the various polymers in the polymer matrix composition, for example, the polybutadiene or polyisoprene polymer and other polymers, can depend on the particular conductive metal layer used, the desired properties of the circuit materials and copper clad laminates, and like considerations. For example, use of a poly(arylene ether) can provide increased bond strength to the conductive metal layer, for example, copper. Use of a polybutadiene or polyisoprene polymer can increase high temperature resistance of the laminates, for example, when these polymers are carboxy-functionalized. Use of an elastomeric block copolymer can function to compatibilize the components of the polymer matrix. Determination of the appropriate quantities of each component can be done without undue experimentation, depending on the desired properties for a particular application.

The magneto-dielectric substrate further comprises magnetic particles, specifically, hexaferrite particles. As is known in the art, hexaferrites, are magnetic iron oxides having a hexagonal structure that can comprise Al, Ba, Bi, Co, Ni, Ir, Mn, Mg, Mo, Nb, Nd, Sr, V, Zn, Zr, or a combination comprising one or more of the foregoing. Different types of hexaferrites include, but are not limited to, M-type ferrites, such as $BaFe_{12}O_{19}$ (BaM or barium ferrite), $SrFe_{12}O_{19}$ (SrM or strontium ferrite), and cobalt-titanium substituted M ferrite, Sr- or $BaFe_{12-2x}Co_xTi_xO_{19}$ (CoTiM); Z-type ferrites ($Ba_3Me_2Fe_{24}O_{41}$) such as $Ba_3Co_2Fe_{24}O_{41}$ (CoZ); Y-type ferrites ($Ba_2Me_2Fe_{12}O_{22}$), such as $Ba_2Co_2Fe_{12}O_{22}$ ($Co_2Y$) or $Mg_2Y$; W-type ferrites ($BaMe_2Fe_{16}O_{27}$), such as $BaCo_2Fe_{16}O_{27}$ ($Co_2W$); X-type ferrites ($Ba_2Me_2Fe_{28}O_{46}$), such as $Ba_2Co_2Fe_{28}O_{46}$ ($Co_2X$); and U-type ferrites ($Ba_4Me_2Fe_{36}O_{60}$), such as $Ba_4Co_2Fe_{36}O_{60}$ ($Co_2U$), wherein in the foregoing formulas, Me is a +2 ion, and Ba can be substituted by Sr. Specific hexaferrites comprise Ba and Co, optionally together with one or more other divalent cations (substituted or doped). The hexaferrite particles can comprise Sr, Ba, Co, Ni, Zn, V, Mn, or a combination comprising at least one of the foregoing, specifically Ba and Co. The magnetic particles can comprise ferromagnetic particles such as ferrite, ferrite alloy, cobalt, cobalt alloy, iron, iron alloy, nickel, nickel alloy, or a combination comprising at least one of the foregoing magnetic materials. The magnetic particles can comprise one or more of hexaferrite, magnetite ($Fe_3O_4$), and $MFe_2O_4$, wherein M comprises at least one of Co, Ni, Zn, V, and Mn, specifically, Co, Ni, and Mn. The magnetic particles can comprise a metal iron oxide of the formula $M_xFe_yO_z$, for example, $MFe_{12}O_{19}$, $Fe_3O_4$, $MFe_{24}O_{41}$, or $MFe_2O_4$, wherein M is Sr, Ba, Co, Ni, Zn, V, and Mn; specifically, Co, Ni, and Mn; or a combination comprising at least one of the foregoing. The magnetic particles can comprise ferromagnetic cobalt carbide particles (such as $Co_2C$ and $Co_3C$ phases), for example, barium cobalt Z Type hexaferrite ($Co_2Z$ Ferrite).

Magnetic particles are commercially available from a number of suppliers including Spherotech, Inc. of Illinois; Trans-Tech, Inc. of Maryland; and Spectrum Magnetics, LLC of Delaware.

The magnetic particles can be present in the magneto-dielectric substrate in an amount of 5 to 60 wt %, specifically, 10 to 50 wt %, or 15 to 45 wt %, each based on the total weight of the magneto-dielectric substrate. The magnetic particles can be present in the magneto-dielectric substrate in an amount of 5 to 60 volume percent (vol %), specifically, 10 to 50 vol %, or 15 to 45 vol %, each based on the total volume of the magneto-dielectric substrate.

The magnetic particles can be surface-treated to aid dispersion into the polymer, for example, with a surfactant, an organic polymer, or a silane or other inorganic material. For example, the particles can be coated with a surfactant such as oleylamine oleic acid, or the like. The silane can comprise phenyl silane, trichloro(phenyl)silane, tris(trimethylsiloxy)phenyl silane, vinyltrimethoxysilane, vinyltriethoxysilane, vinyltris(betamethoxyethoxy)silane, vinylbenzylaminoethylaminopropyltrimethoxysilane, γ-glycidoxypropyltrimethoxysilane, γ-glycidoxypropyltriethoxysilane, γ-methacryloxypropyltrimethoxysilane, γ-methacryloxypropyltriethoxysilane, γ-aminopropyltrimethoxysilane, γ-aminopropyltriethoxysilane, N-β(aminoethyl)γ-aminopropyltrimethoxysilane, N-β(aminoethyl)γ-aminopropyltriethoxysilane, N-phenyl-γ-aminopropyltrimethoxysilane, N-phenyl-γ-aminopropyltriethoxysilane, γ-mercaptopropyltrimethoxysilane, γ-mercaptopropyltriethoxysilane, 3-(triethoxysilyl)propyl succinyl anhydride, 3-chloropropyl-methoxysilane, vinyl-trichlorosilane, or a combination comprising at least one of the foregoing. The silane can comprise phenyl silane. The silane can comprise a substituted phenyl silane, for example, those described in U.S. Pat. No. 4,756,971. The silanes can be present at 0.01 to 2 weight percent, or 0.1 to 1 weight percent, based on the total weight of the magnetic particles. The magnetic particles can be coated with $SiO_2$, $Al_2O_3$, MgO, silver, or a combination comprising one or more of the foregoing. The magnetic particles can be coated by a base-catalyzed sol-gel technique, a polyetherimide (PEI) wet and dry coating technique, or a polyether ether ketone (PEEK) wet and dry coating technique.

The shape of the magnetic particles can be irregular or regular, for example, spherical, ovoid, flakes, and the like. The magnetic particles can comprise one or both of magnetic nano-particles and micrometer sized particles. The magnetic particles can have a $D_{50}$ value by mass of 10 nanometers (nm) to 10 micrometers, specifically, 100 nm to 5 micrometers, more specifically, 1 to 5 micrometers. The magnetic particles can be nano-particles and can have a $D_{50}$ value by mass of 1 to 900 nm, specifically, 1 to 100 nm, more specifically, 5 to 10 nm. The magnetic micro-particles can have a $D_{50}$ value by mass of 1 to 10 micrometers, specifically, 2 to 5 micrometers.

The magnetic particles can comprise magnetic flakes. The magnetic flakes can have a maximum lateral dimension of a 5 to 800 micrometers, specifically, 10 to 500 micrometers; and a thickness of 100 nanometers to 20 micrometers, specifically, 500 nm to 5 micrometers; wherein a ratio of the lateral dimension to the thickness can be greater than or equal to 5, specifically, greater than or equal to 10.

The magneto-dielectric substrate can further optionally include a particulate dielectric filler selected to adjust the dielectric constant, dissipation factor, coefficient of thermal expansion, and other properties of the magneto-dielectric substrate. The dielectric filler can comprise, for example, titanium dioxide (rutile and anatase), barium titanate, strontium titanate, silica (including fused amorphous silica), corundum, wollastonite, $Ba_2Ti_9O_{20}$, solid glass spheres, synthetic glass or ceramic hollow spheres, quartz, boron nitride, aluminum nitride, silicon carbide, beryllia, alumina, alumina trihydrate, magnesia, mica, talcs, nanoclays, magnesium hydroxide, or a combination comprising at least one of the foregoing. A single secondary filler, or a combination of secondary fillers, can be used to provide a desired balance of properties.

Optionally, the dielectric fillers can be surface treated with a silicon-containing coating, for example, an organofunctional alkoxy silane coupling agent. A zirconate or titanate coupling agent can be used. Such coupling agents can improve the dispersion of the filler in the polymeric matrix and reduce water absorption of the finished composite circuit substrate. The filler component can comprise 70 to 30 vol % of fused amorphous silica as secondary filler based on the weight of the filler.

The polymer matrix composition can also optionally contain a flame retardant useful for making the magneto-dielectric substrate resistant to flame. The flame retardant can be halogenated or unhalogenated. The flame retardant can be present in the magneto-dielectric substrate in an amount of 0 to 30 vol % based on the volume of the magneto-dielectric substrate.

The flame retardant can be inorganic and can be present in the form of particles. The inorganic flame retardant can comprise a metal hydrate, having, for example, a volume average particle diameter of 1 to 500 nm, specifically, 1 to 200 nm, or 5 to 200 nm, or 10 to 200 nm; alternatively the volume average particle diameter is 500 nm to 15 micrometer, for example, 1 to 5 micrometer. The metal hydrate can comprise a hydrate of a metal such as Mg, Ca, Al, Fe, Zn, Ba, Cu, Ni, or a combination comprising at least one of the foregoing. Hydrates of Mg, Al, or Ca can be used, for example, aluminum hydroxide, magnesium hydroxide, calcium hydroxide, iron hydroxide, zinc hydroxide, copper hydroxide and nickel hydroxide; and hydrates of calcium aluminate, gypsum dihydrate, zinc borate and barium metaborate. Composites of these hydrates can be used, for example, a hydrate containing Mg and one or more of Ca, Al, Fe, Zn, Ba, Cu, and Ni. A composite metal hydrate can have the formula $MgM_x(OH)_y$ wherein M is Ca, Al, Fe, Zn, Ba, Cu, or Ni, x is 0.1 to 10, and y is 2 to 32. The flame retardant particles can be coated or otherwise treated to improve dispersion and other properties.

Organic flame retardants can be used, alternatively or in addition to the inorganic flame retardants. Examples of inorganic flame retardants include melamine cyanurate, fine particle size melamine polyphosphate, various other phosphorus-containing compounds such as aromatic phosphinates, diphosphinates, phosphonates, phosphates, polysilsesquioxanes, siloxanes, and halogenated compounds such as hexachloroendomethylenetetrahydrophthalic acid (HET acid), tetrabromophthalic acid, and dibromoneopentyl glycol. A flame retardant (such as a bromine-containing flame retardant) can be present in an amount of 20 phr (parts per hundred parts of resin) to 60 phr, specifically, 30 to 45 phr based on the total weight of the resin. Examples of brominated flame retardants include Saytex BT93W (ethylene bistetrabromophthalimide), Saytex 120 (tetradecabromodiphenoxy benzene), and Saytex 102 (decabromodiphenyl oxide). The flame retardant can be used in combination with a synergist, for example, a halogenated flame retardant can be used in combination with a synergists such as antimony trioxide, and a phosphorus-containing flame retardant can be used in combination with a nitrogen-containing compound such as melamine.

The magneto-dielectric substrate can have a magnetic constant of greater than or equal to 1.5 measured over the range of 0 to 500 MHz, or greater than or equal to 2.5, specifically, 3 to 8, each from 0 to 500 MHz. The magneto-dielectric substrate can have a magnetic loss of less than or equal to 0.1, or less than or equal to 0.05, or 0.001 to 0.05, each over 0 to 500 MHz.

The magneto-dielectric substrate can have a dielectric constant (also known as the dielectric permeability) of greater than or equal to 1.5, or greater than or equal to 2.5, or 1.5 to 8, or 3 to 8, or 3.5 to 8, or 6 to 8, each over 0 to 500 MHz. In an embodiment, the magnetic constant and the dielectric constant are matched, i.e., the same, or within 20%, or within 10%, or within 5% of each other. The magneto-dielectric substrate can have a dielectric loss of less than or equal to 0.1, or less than or equal to 0.05, or 0.001 to 0.05, or 0.01 to 0.05, each over 0 to 500 MHz. In an embodiment, the magnetic loss and the dielectric loss are matched, i.e., the same, or within 20%, or within 10%, or within 5% of each other. In an embodiment, the dielectric constant, e', divided by the magnetic constant, u', is less than or equal to 3 ($e'/u' \leq 3$), specifically, less than or equal to 2 ($e'/u' \leq 2$), more specifically less than or equal to 2.2 ($e'/u' \leq 2.2$) and $e'/u'$ can be greater than or equal to 1).

Preferably, each of the magnetic and dielectric constant and the magnetic and dielectric loss are matched, i.e., the same, or within 20%, or within 10%, or within 5% of each other. The magneto-dielectric properties can be measured using a coaxial airline with a Nicholsson-Ross extraction form the scatter parameters measured using a vector network analyzer.

The magneto-dielectric substrate can have improved flammability. For example, the magneto-dielectric substrate can have a UL94 V1 or V0 rating at 1.6 mm.

Unlike other materials, for example, those containing high-temperature thermoplastics or iron particles, the magneto-dielectric substrate can readily withstand the processes used in the manufacture of circuits, including lamination, etching, soldering, drilling, and the like.

The copper bond strength can be in the range of 3 to 7 pli (pounds per linear inch), specifically, 4 to 6 pli, as measured in accordance with IPC test method 650, 2.4.9.

An exemplary magneto-dielectric substrate is shown in FIG. 1. The magneto-dielectric substrate 100 comprises the polymer matrix, the magnetic particles, and optional reinforcing layer 300 as described above. Reinforcing layer 300 can be a woven layer, a non-woven layer, or not used. Magneto-dielectric substrate 100 has a first planar surface 12 and a second planar surface 14. When reinforcing layer 300 and/or a magnetic layer is present magneto-dielectric substrate 100 can have a first dielectric layer portion 16 located on a side of the reinforcing layer and a second dielectric layer portion 18 located on a second side of the reinforcing layer and/or the magnetic layer.

Figure 2:
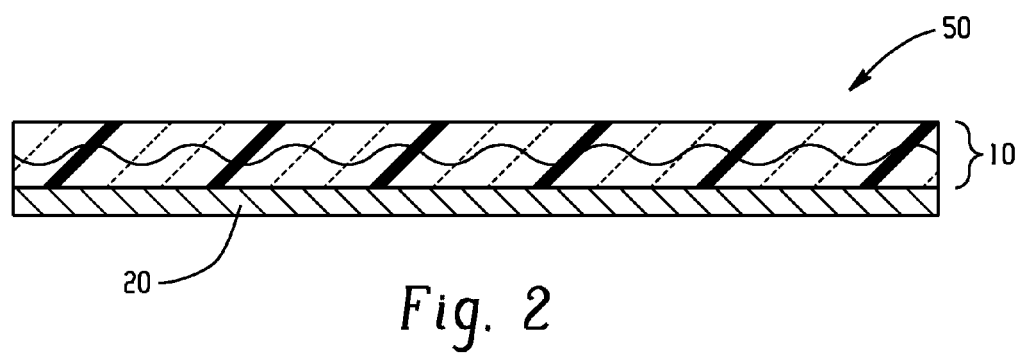
FIG. 2 depicts an embodiment of a section view of a single clad circuit material comprising the magneto-dielectric substrate of FIG. 1.

An exemplary circuit material comprising the magneto-dielectric substrate 100 of FIG. 1 is shown in FIG. 2, wherein a conductive layer 20 is disposed on planar surface 14 of magneto-dielectric substrate 100 to form a single clad circuit material 50. As used herein and throughout the disclosure, "disposed" means that the layers partially or wholly cover each other. An intervening layer, for example, an adhesive layer, can be present between conductive layer 20 and magneto-dielectric substrate 100 (not shown). The magneto-dielectric substrate 100 comprises the polymer matrix, a magnetic particle, and an optionally reinforcing layer 300.

Figure 3:
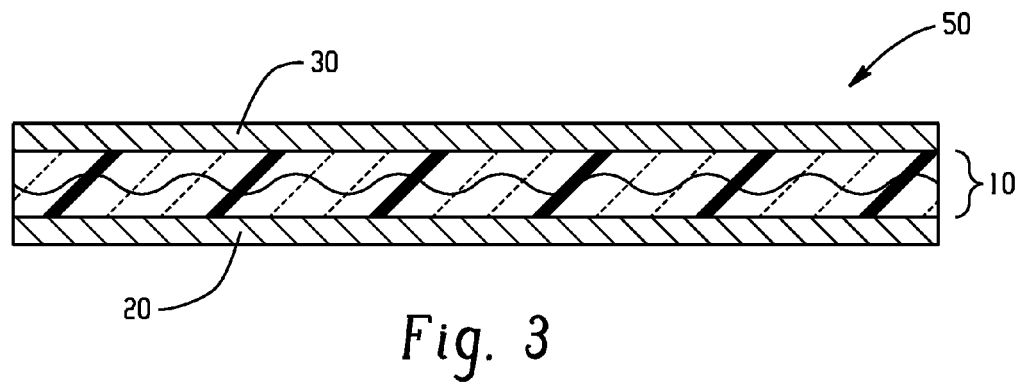
FIG. 3 depicts an embodiment of a double clad circuit material comprising the magneto-dielectric substrate of FIG. 1.

Another exemplary embodiment is shown in FIG. 3, wherein a double clad circuit material 50 comprises magneto-dielectric substrate 100 of FIG. 1 disposed between two conductive layers 20 and 30. One or both conductive layers 20 and 30 can be in the form of a circuit (not shown) to form a double clad circuit. An adhesive (not shown) can be used on one or both sides of layer 100 to increase adhesion between the substrate and the conductive layer(s). Additional layers can be added to result in a multilayer circuit.

Useful conductive layers for the formation of the circuit materials include, for example, stainless steel, copper, gold, silver, aluminum, zinc, tin, lead, transition metals, and alloys comprising at least one of the foregoing. There are no particular limitations regarding the thickness of the conductive layer, nor are there any limitations as to the shape, size, or texture of the surface of the conductive layer. The conductive layer can have a thickness of 3 to 200 micrometers, specifically, 9 to 180 micrometers. When two or more conductive layers are present, the thickness of the two layers can be the same or different. The conductive layer can comprise a copper layer. Suitable conductive layers include a thin layer of a conductive metal such as a copper foil presently used in the formation of circuits, for example, electrodeposited copper foils. The copper foil can have a root mean squared (RMS) roughness of less than or equal to 2 micrometers, specifically, less than or equal to 0.7 micrometers, where roughness is measured using a Veeco Instruments WYCO Optical Profiler, using the method of white light interferometry.

Figure 4:
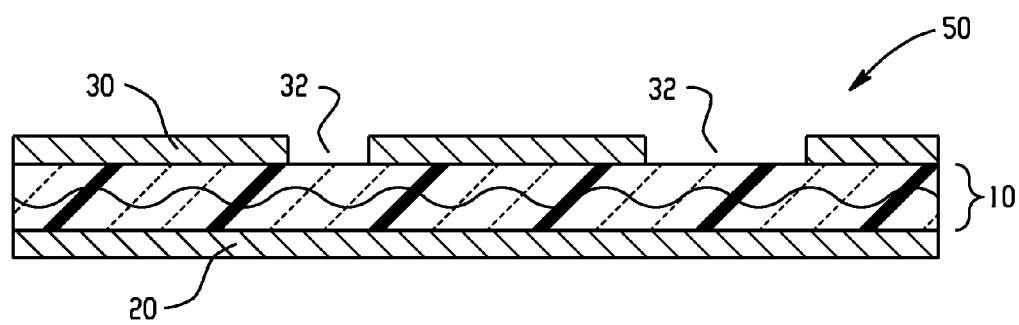
FIG. 4 depicts an embodiment of a section view of the metal clad circuit laminate of FIG. 3 with a patterned patch.

FIG. 4 depicts double clad circuit material 50 having the conductive layer 30 patterned via etching, milling, or any other suitable method. As used herein, the term "patterned" includes an arrangement where the conductive element 30 has in-line and in-plane conductive discontinuities 32. The circuit material can further comprise a signal line, which can be a central signal conductor of a coaxial cable, a feeder strip, or a micro-strip, for example, can be disposed in signal communication with conductive element 30. A coaxial cable can be provided having a ground sheath disposed around the central signal line, the ground sheath can be disposed in electrical ground communication with conductive ground layer 20.

While reinforcing layer 300 is depicted in FIGS. 1-4 by a wavy line having a "line-thickness", it will be appreciated that such depiction is for general illustrative purposes and is not intended to limit the scope of the embodiments disclosed herein. Reinforcing layer 300 can be a woven or nonwoven fibrous material that allows contact between magneto-dielectric substrate 100 through voids in reinforcing layer 300. Thus, magneto-dielectric substrate 100 can be structurally macroscopically in-plane continuous and reinforcing layer 300 can be at least partially, structurally, macroscopically in-plane continuous. As used herein, the term at least partially, structurally, macroscopically in-plane continuous includes both a solid layer, and a fibrous layer (such as a woven or non-woven layer) that can have macroscopic voids. As used herein, the terms "first dielectric layer" and "second dielectric layer" refer to the regions on each side of magnetic reinforcing layer 300, and do not limit the various embodiments to two separate layers. Reinforcing layer 300 can have a material characteristic that includes in-plane magnetic anisotropy.

The various materials and articles used herein, including the magneto-dielectric substrates, magnetic reinforcing layers, circuit materials, and electronic devices comprising the circuit materials can be formed by methods generally known in the art. For example, the magneto-dielectric substrate can be cast directly onto the reinforcing layer, or the reinforcing layer can be coated, for example, dip coated, spray coated, reverse roll coated, knife-over-roll, knife-over-plate, metering rod coated, flow coated, or the like with a solution or mixture comprising the dielectric polymer matrix composition, dielectric filler, magnetic particles, and optional additives. Alternatively, in a lamination process, the reinforcing layer is placed between a first and second magneto-dielectric layer and laminated under heat and pressure. Where the reinforcing layer is fibrous, the magneto-dielectric substrate flows into and impregnates the fibrous magnetic reinforcing layer. An adhesive layer can be placed between the fibrous magnetic reinforcing layer and the magneto-dielectric substrate.

Specifically, the magneto-dielectric substrate can be formed by casting directly, for example, onto the reinforcing layer or a magneto-dielectric substrate can be produced that can be laminated onto the reinforcing layer if one is present. The magneto-dielectric substrate can be produced based on the matrix polymer composition selected. For example, the curable matrix polymer can be mixed with a first carrier liquid. The mixture can comprise a dispersion of polymeric particles in the first carrier liquid, i.e., an emulsion, of liquid droplets of the polymer or of a monomeric or oligomeric precursor of the polymer in the first carrier liquid, or a solution of the polymer in the first carrier liquid. If the polymer is liquid, then no first carrier liquid may be necessary. The mixture can comprise magnetic particles.

The choice of the first carrier liquid, if present, can be based on the particular polymer and the form in which the polymer is to be introduced to the magneto-dielectric substrate. If it is desired to introduce the polymer as a solution, a solvent for the particular curable polymer can be chosen as the carrier liquid, e.g., N-methyl pyrrolidone (NMP) would be a suitable carrier liquid for a solution of a polyimide. If it is desired to introduce the curable polymer as a dispersion, then the carrier liquid can comprise a liquid in which the polymer is not soluble, e.g., water would be a suitable carrier liquid for a dispersion of polymer particles and would be a suitable carrier liquid for an emulsion of polyamic acid or an emulsion of butadiene monomer.

The dielectric filler component and/or magnetic particles can optionally be dispersed in a second carrier liquid, or mixed with the first carrier liquid (or liquid curable polymer where no first carrier is used). The second carrier liquid can be the same liquid or can be a liquid other than the first carrier liquid that is miscible with the first carrier liquid. For example, if the first carrier liquid is water, the second carrier liquid can comprise water or an alcohol. The second carrier liquid can comprise water.

The filler dispersion can comprise a surfactant in an amount effective to modify the surface tension of the second carrier liquid to enable the second carrier liquid to wet the borosilicate microspheres. Examples of surfactant compounds include ionic surfactants and nonionic surfactants. TRITON X-100™ has been found to be a surfactant for use in aqueous filler dispersions. The filler dispersion can comprise 10 to 70 vol % of filler and 0.1 to 10 vol % of surfactant, with the remainder comprising the second carrier liquid.

The combination of the curable polymer and first carrier liquid (if used) and the filler dispersion in the second carrier liquid can be combined to form a casting mixture. The casting mixture can comprise 10 to 60 vol % of the combined curable polymer composition and filler and 40 to 90 vol % combined first and second carrier liquids. The relative amounts of the polymer and the filler component in the casting mixture can be selected to provide the desired amounts in the final composition as described below.

The viscosity of the casting mixture can be adjusted by the addition of a viscosity modifier, selected on the basis of its compatibility in a particular carrier liquid or mixture of carrier liquids, to retard separation, i.e., sedimentation or flotation, of the hollow sphere filler from the dielectric composite material and to provide a dielectric composite material having a viscosity compatible with conventional laminating equipment. Viscosity modifiers suitable for use in aqueous casting mixtures include, e.g., polyacrylic acid compounds, vegetable gums, and cellulose based compounds. Specific examples of suitable viscosity modifiers include polyacrylic acid, methyl cellulose, polyethyleneoxide, guar gum, locust bean gum, sodium carboxymethylcellulose, sodium alginate, and gum tragacanth. The viscosity of the viscosity-adjusted casting mixture can be further increased, i.e., beyond the minimum viscosity, on an application by application basis to adapt the dielectric composite material to the selected laminating technique. The viscosity-adjusted casting mixture can exhibit a viscosity of 10 to 100,000 centipoise (cp); specifically, 100 cp to 10,000 cp measured at room temperature (for example, at 23 to 25° C.).

Alternatively, the viscosity modifier can be omitted if the viscosity of the carrier liquid is sufficient to provide a casting mixture that does not separate during the time period of interest. Specifically, in the case of extremely small particles, e.g., particles having an equivalent spherical diameter less than 0.1 micrometers, the use of a viscosity modifier may not be necessary.

A layer of the viscosity-adjusted casting mixture can be cast onto a reinforcing layer, or can be dip-coated. The casting can be achieved by, for example, dip coating, flow coating, reverse roll coating, knife-over-roll, knife-over-plate, metering rod coating, and the like. Likewise, the viscosity-adjusted casting mixture can be cast onto a surface free of a reinforcing layer.

The carrier liquid and processing aids, i.e., the surfactant and viscosity modifier, can be removed from the cast layer, for example, by evaporation and/or by thermal decomposition in order to consolidate a magneto-dielectric substrate of the polymer and optionally a filler and/or the magnetic particles. The layer of the polymeric matrix and optionally the filler and/or the magnetic particles can be further heated to cure the polymer. The magneto-dielectric substrate can be cast and then partially cured ("B-staged"). Such B-staged layers can be stored and used subsequently, e.g., in lamination processes.

A single clad circuit material can be formed by casting or laminating the magneto-dielectric substrate onto the optional reinforcing layer; and adhering or laminating a conductive layer to a planar surface of the magneto-dielectric substrate. A double clad circuit material can be formed by casting or laminating the magneto-dielectric substrate onto the optional reinforcing layer; and applying a first and a second conductive element to the planar surfaces of the magneto-dielectric substrate simultaneously or sequentially. One or more of the optional reinforcing layer and the magneto-dielectric substrate can comprise the magnetic particles and/or the magnetic particles can be present in a layer located in between the reinforcing layer and a portion of the magneto-dielectric substrate. Lamination can be conducted at a temperature and for a time effective to cure (or complete the cure) of the curable matrix polymer.

The conductive layer can be applied by placing the conductive layer in the mold prior to molding, by laminating the conductive layer onto the magneto-dielectric substrate, by direct laser structuring, or by adhering the conductive layer to the magneto-dielectric substrate via an adhesive layer. The laminating can entail placing a magneto-dielectric substrate between one or two sheets of coated or uncoated conductive layers (an intermediate layer can be disposed between at least one conductive layer and the magneto-dielectric substrate) to form a layered structure. Alternatively, the conductive layer can be in direct contact with the magneto-dielectric substrate or optional intermediate layer, specifically, without an intervening layer, wherein an optional intermediate layer can be less than or equal to 10% of the thickness of the total thickness of the total of the magneto-dielectric substrate. The layered structure can then be placed in a press, e.g., a vacuum press, under a pressure and temperature and for duration of time suitable to bond the layers and form a laminate Lamination and curing can be by a one-step process, for example, using a vacuum press, or can be by a multi-step process. In a one-step process, the layered structure can be placed in a press, brought up to laminating pressure (e.g., 150 to 400 pounds per square inch (psi) (1 to 2.8 MPa) and heated to laminating temperature (e.g., 260 to 390 degrees Celsius (° C.)). The laminating temperature and pressure can be maintained for the desired soak time, i.e., 20 minutes, and thereafter cooled (while still under pressure) to less than or equal to 150° C.

If present, the intermediate layer can comprise a polyfluorocarbon film that can be located in between the conductive layer and the magneto-dielectric substrate, and an optional layer of microglass reinforced fluorocarbon polymer that can be located in between the polyfluorocarbon film and the conductive layer. The layer of microglass reinforced fluorocarbon polymer can increase the adhesion of the conductive layer to the magneto-dielectric substrate. The microglass can be present in an amount of 4 to 30 wt % based on the total weight of the layer. The microglass can have a longest length scale of less than or equal to 900 micrometers, specifically, less than or equal to 500 micrometers. The microglass can be microglass of the type as commercially available by Johns-Manville Corporation of Denver, Colo. The polyfluorocarbon film comprises a fluoropolymer (such as polytetrafluoroethylene (PTFE), a fluorinated ethylene-propylene copolymer (such as Teflon FEP), and a copolymer having a tetrafluoroethylene backbone with a fully fluorinated alkoxy side chain (such as Teflon PFA)).

The conductive layer can be applied by laser direct structuring. Here, the magneto-dielectric substrate can comprise a laser direct structuring additive; and the laser direct structuring can comprise using a laser to irradiate the surface of the substrate, forming a track of the laser direct structuring additive, and applying a conductive metal to the track. The laser direct structuring additive can comprise a metal oxide particle (such as titanium oxide and copper chromium oxide). The laser direct structuring additive can comprise a spinel-based inorganic metal oxide particle, such as spinel copper. The metal oxide particle can be coated, for example, with a composition comprising tin and antimony (for example, 50 to 99 wt % of tin and 1 to 50 wt % of antimony, based on the total weight of the coating). The laser direct structuring additive can comprise 2 to 20 parts of the additive based on 100 parts of the respective composition. The irradiating can be performed with a YAG laser having a wavelength of 1,064 nanometers under an output power of 10 Watts, a frequency of 80 kHz, and a rate of 3 meters per second. The conductive metal can be applied using a plating process in an electroless plating bath comprising, for example, copper.

Alternatively, the conductive layer can be applied by adhesively applying the conductive layer. In an embodiment, the conductive layer is the circuit (the metallized layer of another circuit), for example, a flex circuit. For example, an adhesion layer can be disposed between one or both of the conductive layer(s) and the magneto-dielectric substrate. The adhesion layer can comprise a poly(arylene ether); and a carboxy-functionalized polybutadiene or polyisoprene polymer comprising butadiene, isoprene, or butadiene and isoprene units, and zero to less than or equal to 50 wt % of co-curable monomer units; wherein the composition of the adhesive layer is not the same as the composition of the substrate layer. The adhesive layer can be present in an amount of 2 to 15 grams per square meter. The poly(arylene ether) can comprise a carboxy-functionalized poly(arylene ether). The poly(arylene ether) can be the reaction product of a poly(arylene ether) and a cyclic anhydride, or the reaction product of a poly(arylene ether) and maleic anhydride. The carboxy-functionalized polybutadiene or polyisoprene polymer can be a carboxy-functionalized butadiene-styrene copolymer. The carboxy-functionalized polybutadiene or polyisoprene polymer can be the reaction product of a polybutadiene or polyisoprene polymer and a cyclic anhydride. The carboxy-functionalized polybutadiene or polyisoprene polymer can be a maleinized polybutadiene-styrene or maleinized polyisoprene-styrene copolymer. Other methods known in the art can be used to apply the conductive layer where admitted by the particular materials and form of the circuit material, for example, electrodeposition, chemical vapor deposition, lamination, or the like.

A multiple-step process suitable for thermosetting materials such as polybutadiene and/or polyisoprene can comprise a peroxide cure step at temperatures of 150 to 200° C., and the partially cured stack can then be subjected to a high-energy electron beam irradiation cure (E-beam cure) or a high temperature cure step under an inert atmosphere. Use of a two-stage cure can impart an unusually high degree of crosslinking to the resulting laminate. The temperature used in the second stage can be 250 to 300° C., or the decomposition temperature of the polymer. This high temperature cure can be carried out in an oven, but can also be performed in a press, namely as a continuation of the initial lamination and cure step. Particular lamination temperatures and pressures will depend upon the particular adhesive composition and the substrate composition, and are readily ascertainable by one of ordinary skill in the art without undue experimentation.

The circuit materials and circuits can be used in electronic devices such as inductors on electronic integrated circuit chips, electronic circuits, electronic packages, modules and housings, transducers, and UHF, VHF, and microwave antennas for a wide variety of applications, for example, electric power applications, data storage, and microwave communication. The circuit assembly can be used in applications where an external direct current magnetic field is applied. Additionally, the magnetic layer(s) can be used with very good results (size and bandwidth) in all antenna designs over the frequency range of 100 to 800 MHz. Furthermore, the application of an external magnetic field can "tune" the magnetic permeability of the magnetic layer(s) and, therefore, the resonant frequency of the patch. The magneto-dielectric substrate can be used in a radio-frequency (RF) component.

EXAMPLES

Examples 1 to 6

Magneto-dielectric substrates comprising a magnetic particle and a thermoplastic polymer were tested over a range of frequencies as described below.

The magneto-dielectric substrate of Example 1 (a comparative example) comprises 40 vol % of Fe magnetic particles in a thermosetting polybutadiene/polyisoprene material as described above (RO4000 with no dielectric filler or glass cloth from Rogers Corporation) is denoted in FIGS. 5 to 8 by the diamonds.

The magneto-dielectric substrate of Example 2 (a comparative example) comprises 40 vol % of nickel zinc ferrite particles in a thermosetting polybutadiene/polyisoprene material as described above (RO4000 with no dielectric filler or glass cloth from Rogers Corporation) is denoted in FIGS. 5 to 8 by the squares.

The magneto-dielectric substrate of Example 3 (a comparative example) comprises Co—Ba-hexaferrite particles in a thermoplastic polymer of high density polyethylene with no dielectric filler or glass cloth and is denoted in FIGS. 5 to 8 by the triangles.

The magneto-dielectric substrate of Example 4 (a comparative example) comprises 40 vol % nickel zinc ferrite particles in thermosetting polybutadiene/polyisoprene material as described above (RO4000 with no dielectric filler or glass cloth from Rogers Corporation) and is denoted in FIGS. 5 to 8 by the Xs.

The magneto-dielectric substrate of Example 5 (an inventive example) comprises 40 vol % of Co—Ba-hexaferrite magnetic particles in thermosetting polybutadiene/polyisoprene material as described above (RO4000 with no dielectric filler or glass cloth from Rogers Corporation) and is denoted in FIGS. 5 to 8 by the X's with a vertical bar.

The magneto-dielectric substrate of Example 6 (an inventive example) is a second sample of the magneto-dielectric substrate of Example 5 and is denoted in FIGS. 5 to 8 by the circles.

Figure 5:
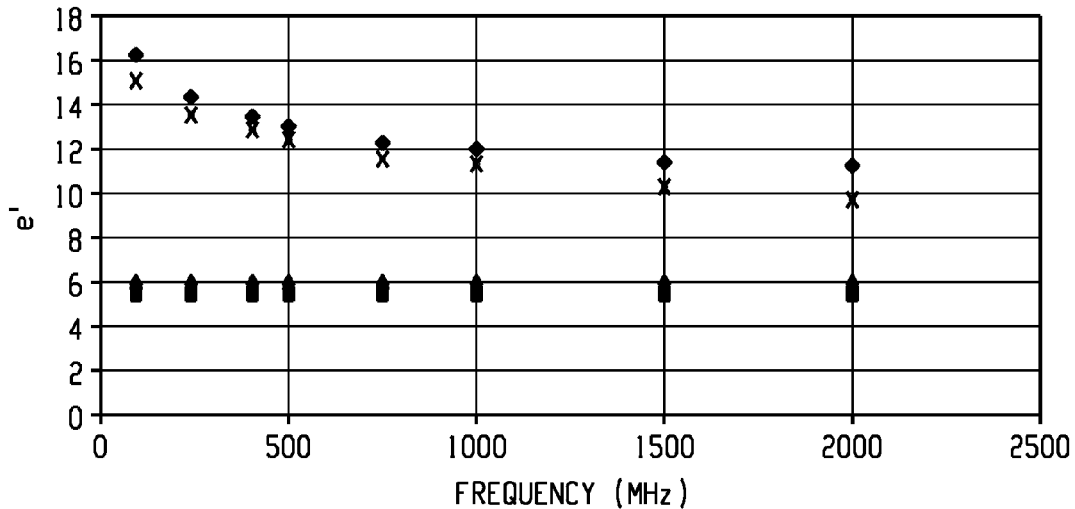
FIG. 5 is a graph showing dielectric constant (e') values versus frequency for Examples 1 to 6.

FIG. 5 shows that Examples 1 to 6 all have a dielectric constant (e') of greater than 1.5, specifically greater than 4. FIG. 5 further shows that Examples 2, 3, 5, and 6 have a dielectric constant of 4 to 8 at frequencies of 0 to 500 MHz. Examples 2, 3, 5, and 6, desirably have dielectric constants that are within three times the value of the magnetic constant (specifically, $e'/u' \leq 2.2$) over the frequency range of 100 to 500 MHz, whereas Examples 1 and 4 have dielectric constants that are greater than three times that of the magnetic constant over the frequency range of 100 to 500 MHz.

Figure 6:
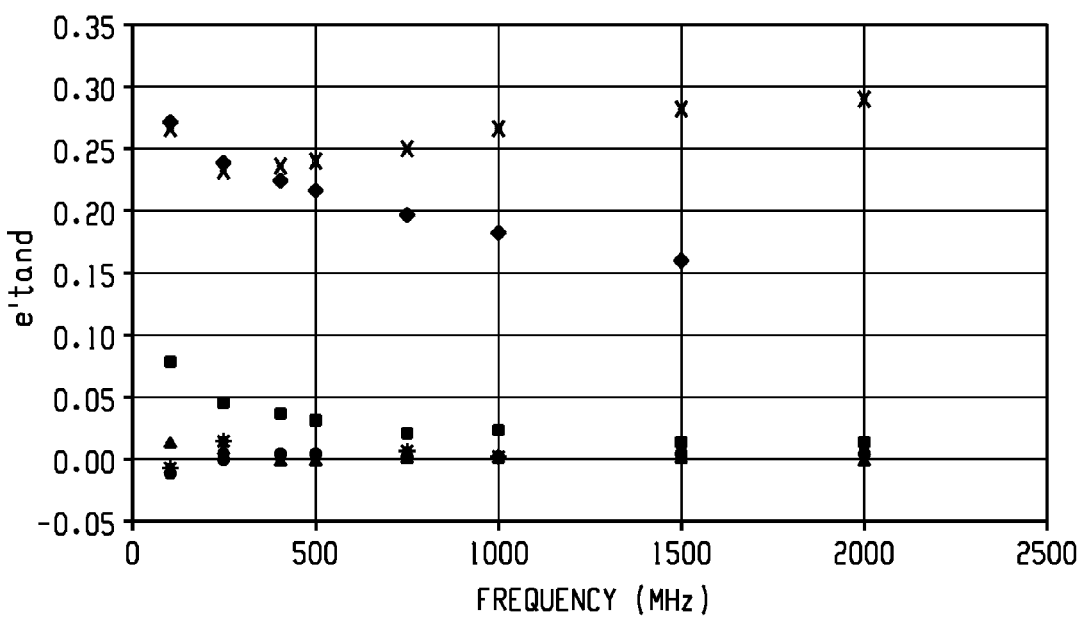
FIG. 6 is a graph showing dielectric loss (e' tan delta) versus frequency for Examples 1 to 6.

FIG. 6 shows that Examples 2, 3, 5, and 6 have significantly better dielectric loss (e' tan delta, "e'tand") compared to Examples 1 and 4 that undesirably have high dielectric loss values of greater than 0.2 from 0 to 500 MHz. Examples 2, 3, 5, and 6 each have a dielectric loss of less than 0.1 from 0 to 500 MHz, and Examples 3, 5, and 6 each have a dielectric loss of less than 0.05 from 0 to 500 MHz.

Figure 7:
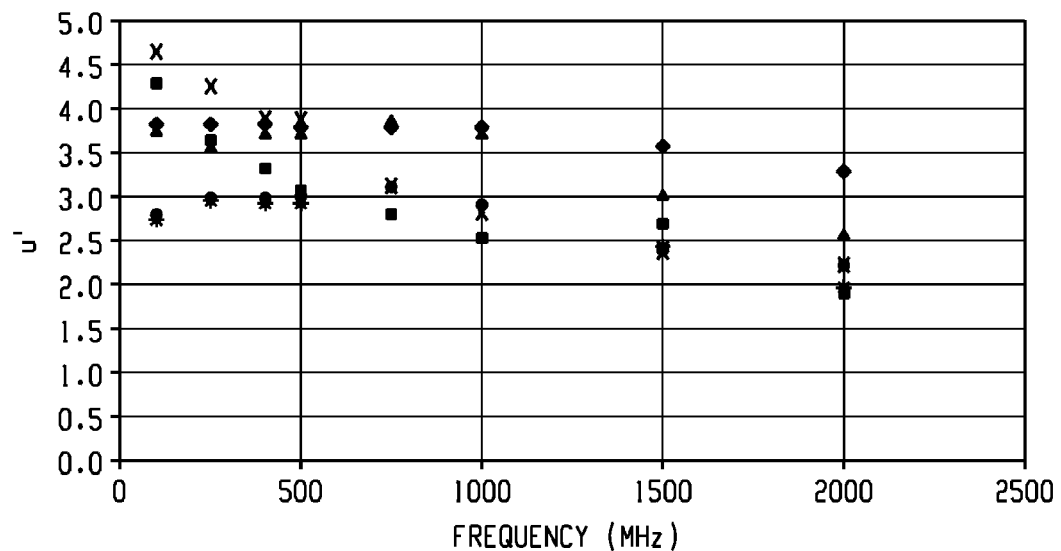
FIG. 7 is a graph showing magnetic constant (u') versus frequency for Examples 1 to 6.

The magnetic constant (u') versus frequency for the magneto-dielectric substrates of Examples 1 to 6 are shown in FIG. 7. Magnetic constant for all examples is greater than 1.5.

Figure 8:
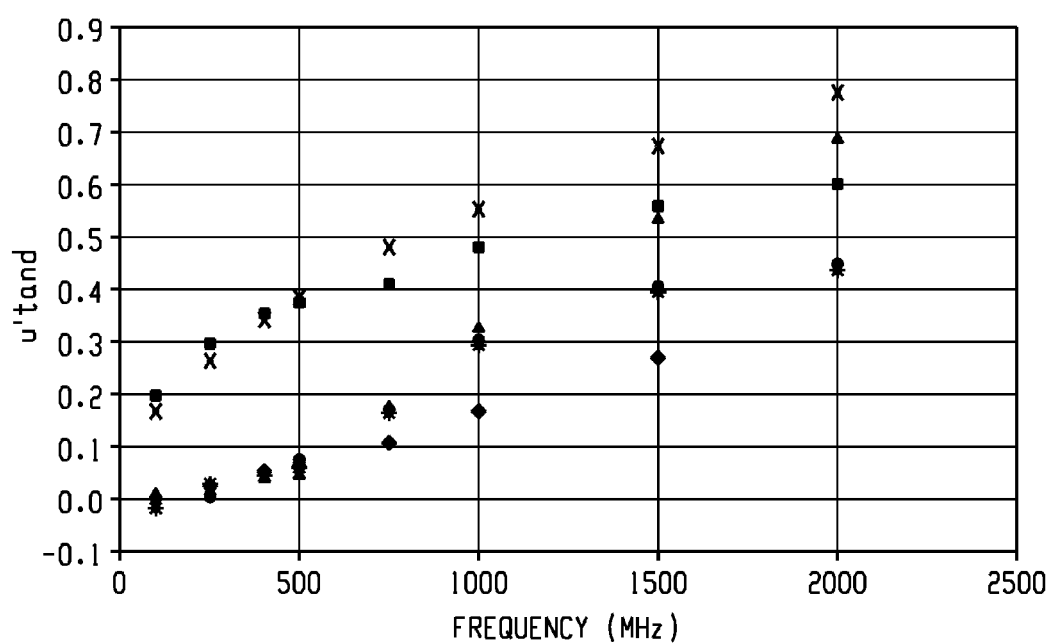
FIG. 8 is a graph showing magnetic loss (u' tan delta) versus frequency for Examples 1 to 6.

The magnetic loss values (u' tan delta, "u'tand") versus frequency are shown in FIG. 8. The best magnetic loss values from 0 to 500 MHz are observed for Examples 1, 3, 5, and 6 (the data points for Examples 1, 3, 5, and 6 are generally coincident on the graph from 0 to 500 MHz). Each of these Examples has a magnetic loss of less than 0.1 from 0 to 500 MHz.

Examples 3, 5, and 6 therefore have the best combination of magnetic and dielectric properties. In addition to relatively poor magnetic loss, it was further found that the materials of Example 1 were highly flammable. The materials of Examples 4 and 5, while having a combination of magnetic and dielectric properties, have disadvantages from the viewpoint of manufacturing, because the thermoplastic polymers are subject to defects during lamination, and particularly during circuitization. The materials of Examples 5 and 6, on the other hand, readily withstand circuitization and other manufacturing processes, including lamination, etching, drilling, soldering, and the like.

The coefficient of thermal expansion for Examples 5 and 6 was found to be 16.5 to $17 \times 10^{-6}$ meters per meter Kelvin (m/mK) in the x-y direction and $40 \times 10^{-6}$ m/mK in the z direction over the temperature range of 0 to 200° C.

Set forth below are some embodiments of the present magneto-dielectric substrate.

Embodiment 1

A magneto-dielectric substrate, comprising: a thermoset polymer matrix; and a plurality of hexaferrite particles dispersed in the polymer matrix in an amount and of a type effective to provide the magneto-dielectric substrate having a magnetic constant of greater than or equal to 2.5 from 0 to 500 MHz, or 3 to 8 from 0 to 500 MHz, a magnetic loss of less than or equal to 0.1 from 0 to 500 MHz, or 0.001 to 0.05 over 0 to 500 MHz; and a dielectric constant of 1.5 to 8 or 2.5 to 8 from 0 to 500 MHz.

Embodiment 2

The magneto-dielectric substrate of Embodiment 1, wherein the magneto-dielectric substrate further has at least one of a dielectric loss of less than 0.01 or less than 0.005 over 0 to 500 MHz; a UL94 V1 rating measured at a thickness of 1.6 mm; and a peel strength to copper of 3 to 7 pli measured in accordance with IPC test method 650, 2.4.9.

Embodiment 3

The magneto-dielectric substrate of any of the preceding embodiments, wherein the plurality of hexaferrite particles is present in the magneto-dielectric substrate in an amount of 5 to 60 vol %, or 10 to 50 vol %, or 15 to 45 vol %, based on the total volume of the magneto-dielectric substrate.

Embodiment 4

The magneto-dielectric substrate of any of the preceding embodiments, wherein the thermoset comprises polybutadiene, polyisoprene, an epoxy; a phenolic polymer; a polyester; a polyimide; a silicone; a bismaleimide triazine (BT) resin; a benzoxazine; a polystyrene; a poly(($C_{1-4}$ alkyl methacrylate), a poly($C_{1-4}$ alkyl acrylate); an allylated poly (arylene ether), or a combination comprising at least one of the foregoing polymers; specifically, the thermoplastic can comprise polybutadiene, polyisoprene, polyetherimide, polyimide, polyamidimide, or a combination comprising at least one of the foregoing; more specifically, the thermoplastic can comprise polybutadiene, polyisoprene, or a combination comprising at least one of the foregoing.

Embodiment 5

The magneto-dielectric substrate of any of the preceding embodiments, wherein the magneto-dielectric substrate comprises a polybutadiene and/or a polyisoprene; optionally an ethylene-propylene liquid rubber having a weight average molecular weight of less than or equal to 50,000 g/mol as measured by gel permeation chromatography based on polycarbonate standards; optionally, a dielectric filler; and optionally, a flame retardant.

Embodiment 6

The magneto-dielectric substrate of any of the preceding embodiments, wherein the plurality of hexaferrite particles comprises Sr, Ba, Co, Ni, Zn, V, Mn, or a combination comprising one or more of the foregoing.

Embodiment 7

The magneto-dielectric substrate of any of the preceding embodiments, wherein the plurality of hexaferrite particles comprises Ba and Co.

Embodiment 8

The magneto-dielectric substrate of any of the preceding embodiments, wherein the plurality of hexaferrite particles comprises an organic polymer coating, a surfactant coating, a silane coating, or a combination comprising at least one of the foregoing, specifically, a silane coating; specifically, the silane coating can comprise phenyl silane, trichloro(phenyl) silane, tris(trimethylsiloxy)phenyl silane, vinyltrimethoxysilane, vinyltriethoxysilane, vinyltris(betamethoxyethoxy)silane, vinylbenzylaminoethylaminopropyltrimethoxysilane, γ-glycidoxypropyltrimethoxysilane, γ-glycidoxypropyltriethoxysilane, γ-methacryloxypropyltrimethoxysilane, γ-methacryloxypropyltriethoxysilane, γ-aminopropyltrimethoxysilane, γ-aminopropyltriethoxysilane, N-β(aminoethyl)γ-aminopropyltrimethoxysilane, N-β(aminoethyl)γ-aminopropyltriethoxysilane, N-phenyl-γ-aminopropyltrimethoxysilane, N-phenyl-γ-aminopropyltriethoxysilane, γ-mercaptopropyltrimethoxysilane, γ-mercaptopropyltriethoxysilane, 3-(triethoxysilyl)propyl succinyl anhydride, 3-chloropropyl-methoxysilane, vinyl-trichlorosilane, or a combination comprising at least one of the foregoing; specifically, the silane can comprise phenyl silane or a substituted phenyl silane; specifically, phenyl silane.

Embodiment 9

The magneto-dielectric substrate of any of the preceding embodiments, further comprising a fibrous reinforcing layer comprising woven or non-woven fibers.

Embodiment 10

The magneto-dielectric substrate of Embodiment 9, wherein the fibers comprise glass fibers, ferrite fibers, ferrite alloy fibers, cobalt fibers, cobalt alloy fibers, iron fibers, iron alloy fibers, nickel fibers, nickel alloy fibers, polymer fibers comprising particulate ferrite, a particulate ferrite alloy, particulate cobalt, a particulate cobalt alloy, particulate iron, a particulate iron alloy, particulate nickel, a particulate nickel alloy, or a combination comprising at least one of the foregoing.

Embodiment 11

The magneto-dielectric substrate of any of Embodiments 9 to 10, wherein the fibers comprise polymer fibers or glass fibers.

Embodiment 12

A method of making the magneto-dielectric substrate of any of the preceding embodiments, the method comprising dispersing a plurality of hexaferrite particles in a curable polymer matrix composition; forming a layer from the curable polymer matrix composition and the dispersed particles; and curing the polymer matrix composition to form the magneto-dielectric substrate.

Embodiment 13

The method of Embodiment 12, further comprising impregnating the fibrous reinforcing layer with the curable polymer matrix composition and the dispersed particles to form the layer; and partially curing the polymer matrix composition of the layer to provide a prepreg.

Embodiment 14

A circuit material, comprising a conductive layer; and the magneto-dielectric substrate of any of Embodiments 1 to 11 disposed on the conductive layer.

Embodiment 15

The circuit material of Embodiment 14, wherein the conductive layer is copper.

Embodiment 16

A method of making the circuit material of Embodiment 14 or 15, the method comprising dispersing a plurality of hexaferrite particles in a curable polymer matrix composition; forming a layer from the curable polymer matrix composition and the dispersed particles on a conductive layer; and curing the polymer matrix composition.

Embodiment 17

The method of Embodiment 16, wherein the curing is by laminating.

Embodiment 18

The method of Embodiment 16 or 17, wherein the forming comprises impregnating the fibrous reinforcing layer with the curable polymer matrix composition and the dispersed particles; and partially curing the polymer matrix composition of the layer to provide a prepreg before disposing the prepreg on the conductive layer.

Embodiment 19

A circuit comprising the circuit material of any of Embodiments 14 to 18.

Embodiment 20

A method of making the circuit of Embodiment 19, further comprising patterning the conductive layer.

Embodiment 21

An antenna comprising the circuit of Embodiment 19 or 20.

Embodiment 22

An RF component comprising the magneto-dielectric substrate of any one or more of Embodiments 1 to 11.

Layer" as used herein includes planar films, sheets, and the like as well as other three-dimensional non-planar forms. A layer can further be macroscopically continuous or non-continuous. Use of the terms "a" and "an" do not denote a limitation of quantity, but rather denote the presence of at least one of the referenced item. "Or" means "and/or." Ranges disclosed herein are inclusive of the recited endpoint and are independently combinable. "Combination" is inclusive of blends, mixtures, alloys, reaction products, and the like. Also, "combinations comprising at least one of the foregoing" means that the list is inclusive of each element individually, as well as combinations of two or more elements of the list, and combinations of at least one element of the list with like elements not named. The terms "first," "second," and so forth, herein do not denote any order, quantity, or importance, but rather are used to distinguish one element from another. As used herein, the term "substantially equal" means that the two values of comparison are plus or minus 10% of each other, specifically, plus or minus 5% of each other, more specifically, plus or minus 1% of each other.

While certain combinations of features have been described herein, it will be appreciated that these certain combinations are for illustration purposes only and that any combination of any of these features can be employed, explicitly or equivalently, either individually or in combination with any other of the features disclosed herein, in any combination, and all in accordance with an embodiment. Any and all such combinations are contemplated herein and are considered within the scope of the disclosure.

While the invention has been described with reference to exemplary embodiments, it will be understood by those skilled in the art that various changes can be made and equivalents can be substituted for elements thereof without departing from the scope of this disclosure. In addition, many modifications can be made to adapt a particular situation or material to the teachings without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments and, although specific terms can have been employed, they are unless otherwise stated used in a generic and descriptive sense only and not for purposes of limitation.

We claim:

1. A magneto-dielectric substrate, comprising:
   a thermoset polymer matrix comprising a polybutadiene, a polyisoprene, a polyimide, or a combination comprising at least one of the foregoing; and
   a plurality of hexaferrite particles dispersed in the polymer matrix in an amount and of a type effective to provide the magneto-dielectric substrate having
      a magnetic constant of greater than or equal to 2.5 from 0 to 500 MHz, or 3 to 8 from 0 to 500 MHz,
      a magnetic loss of less than or equal to 0.1 from 0 to 500 MHz, or 0.001 to 0.05 over 0 to 500 MHz
      a dielectric constant of 1.5 to 8 or 2.5 to 8 from 0 to 500 MHz;
      a ratio of the dielectric constant to the magnetic constant of 1 to 2; and
      a peel strength to copper of 3 to 7 pli measured in accordance with IPC test method 650, 2.4.9.

2. The magneto-dielectric substrate of claim 1, wherein the magneto-dielectric substrate further has at least one of
   a dielectric loss of less than 0.01 or less than 0.005 over 0 to 500 MHz; and
   a UL94 V1 rating measured at a thickness of 1.6 mm; and the magnetic constant is 2.5 to 3.1.

3. The magneto-dielectric substrate of claim 1, wherein the plurality of hexaferrite particles is present in the magneto-dielectric substrate in an amount of 5 to 60 vol %, or 10 to 50 vol %, or 15 to 45 vol %, based on the total volume of the magneto-dielectric substrate.

4. The magneto-dielectric substrate of claim 1, wherein the polymer matrix comprises the polybutadiene and/or the polyisoprene;
   optionally an ethylene-propylene liquid rubber having a weight average molecular weight of less than or equal to 50,000 g/mol as measured by gel permeation chromatography based on polycarbonate standards;
   optionally, a dielectric filler; and
   optionally, a flame retardant.

5. The magneto-dielectric substrate of claim 1, wherein the plurality of hexaferrite particles comprises Sr, Ba, Co, Ni, Zn, V, Mn, or a combination comprising one or more of the foregoing.

6. The magneto-dielectric substrate of claim 1, wherein the plurality of hexaferrite particles comprises Ba and Co.

7. The magneto-dielectric substrate of claim 1, wherein the plurality of hexaferrite particles comprises a silane coating.

8. The magneto-dielectric substrate of claim 1, further comprising a fibrous reinforcing layer comprising woven or non-woven fibers.

9. The magneto-dielectric substrate of claim 8, wherein the fibers comprise glass fibers, ferrite fibers, ferrite alloy fibers, cobalt fibers, cobalt alloy fibers, iron fibers, iron alloy fibers, nickel fibers, nickel alloy fibers, polymer fibers comprising particulate ferrite, a particulate ferrite alloy, particulate cobalt, a particulate cobalt alloy, particulate iron, a particulate iron alloy, particulate nickel, a particulate nickel alloy, or a combination comprising at least one of the foregoing.

10. A method of making the magneto-dielectric substrate of claim 1, the method comprising
    dispersing the plurality of hexaferrite particles in a curable polymer matrix composition to form a dispersed composition;

forming a layer from the dispersed composition; and curing the curable polymer matrix composition to form the magneto-dielectric substrate.

11. The method of claim 10, further comprising impregnating a fibrous reinforcing layer with the dispersed composition; and partially curing the polymer matrix composition of the layer to provide a prepreg.

12. The magneto-dielectric substrate of claim 1, further comprising a conductive layer disposed on the magneto-dielectric substrate.

13. The method of claim 10, the method further comprising disposing the layer on the conductive layer; and then curing the curable polymer matrix composition.

14. The method of claim 13, wherein the curing is by laminating.

15. The method of claim 13, wherein the forming comprises impregnating a fibrous reinforcing layer with the dispersed composition; and partially curing the curable polymer matrix composition to provide a prepreg before disposing the prepreg on the conductive layer.

16. The method of claim 13, further comprising patterning the conductive layer.

17. An article comprising the magneto-dielectric substrate of claim 1.

18. The article of claim 17; wherein the magneto-dielectric substrate further comprises a conductive layer; and wherein the article is a circuit material or an antenna comprising the circuit material.

19. The article of claim 17; wherein the article is an RF component.

* * * * *